United States Patent [19] [11] Patent Number: 6,114,187
Hayes [45] Date of Patent: Sep. 5, 2000

[54] METHOD FOR PREPARING A CHIP SCALE PACKAGE AND PRODUCT PRODUCED BY THE METHOD

[75] Inventor: Donald J. Hayes, Plano, Tex.

[73] Assignee: MicroFab Technologies, Inc., Plano, Tex.

[21] Appl. No.: 09/004,392

[22] Filed: Jan. 8, 1998

Related U.S. Application Data

[60] Provisional application No. 60/035,305, Jan. 11, 1997.

[51] Int. Cl.[7] ............................ H01L 21/44; H01L 21/48; H01L 21/50

[52] U.S. Cl. ............................ 438/106; 438/108; 438/612; 438/613; 29/890.01; 228/179.1

[58] Field of Search ................................. 438/106, 108, 438/612, 613; 29/890.01; 228/179.1

[56] References Cited

U.S. PATENT DOCUMENTS

| | | | |
|---|---|---|---|
| 3,683,212 | 8/1972 | Zoltan | 310/8.3 |
| 3,857,049 | 12/1974 | Zoltan | 310/8.1 |
| 5,433,809 | 7/1995 | Pies et al. | 156/268 |
| 5,436,648 | 7/1995 | Stortz et al. | 347/10 |
| 5,461,403 | 10/1995 | Wallace et al. | 347/10 |

*Primary Examiner*—John F. Niebling
*Assistant Examiner*—David A Zarneke
*Attorney, Agent, or Firm*—Locke Liddell & Sapp, LLP

[57] ABSTRACT

Solder jetting technology is employed to prepare a chip scale package which is "bumped" in preparation for making electrical interconnections with pads on a connection surface of the chip. The chip scale packages can be produced in wafer form before severing the wafer to produce individually packaged chips. In one embodiment a column is built on each pad of the chip connection surface and then the pads and columns are covered with a layer of dielectric jetted on to the connection surface to provide the package. The upper surface portion of the dielectric layer is removed to expose the ends of the columns. The ends of the columns are then bumped using solder jet technology to ready the package for subsequent electrical interconnections. An alternate embodiment employs taller columns which extend above the layer of dielectric. A solder reflow operation is applied to convert the exposed upper ends of the columns into generally spherical balls. The technique also allows vertical solder columns to be extended laterally along the surface of a first dielectric layer and a second dielectric layer applied wherein a second vertical portion of column is bumped in order to make a connection.

32 Claims, 7 Drawing Sheets

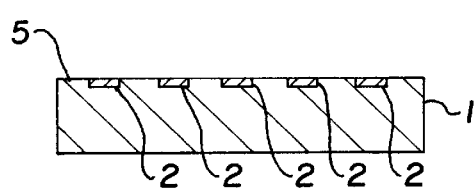
Fig. 2a
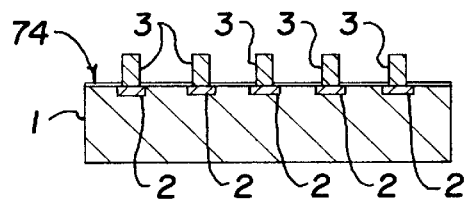
Fig. 2b1
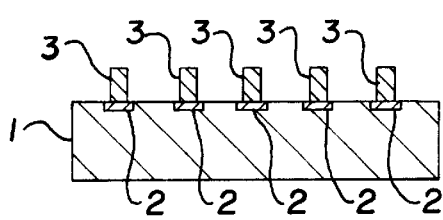
Fig. 2b
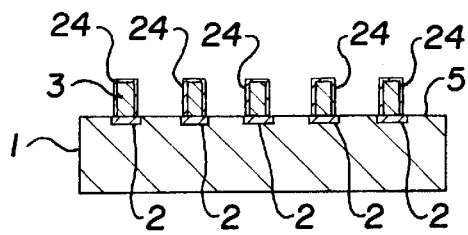
Fig. 2f
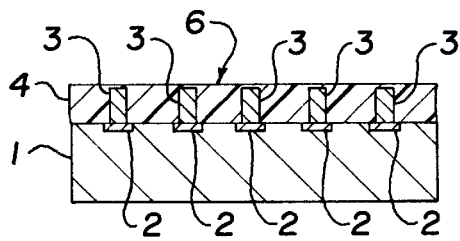
Fig. 2c
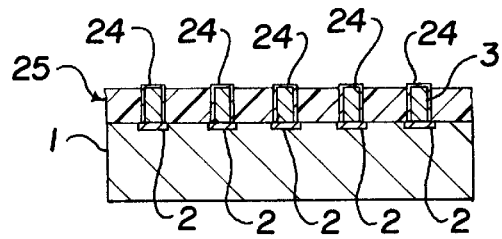
Fig. 2g
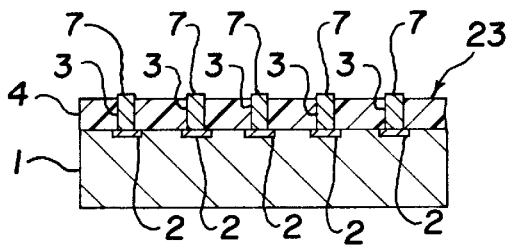
Fig. 2d
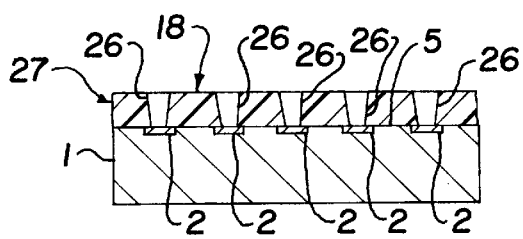
Fig. 2h
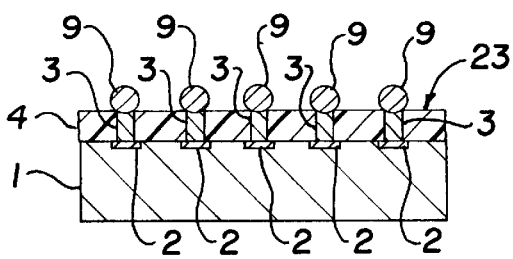
Fig. 2e
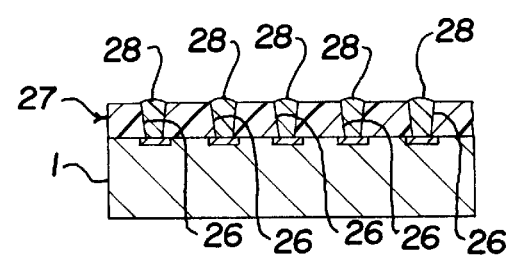
Fig. 2i

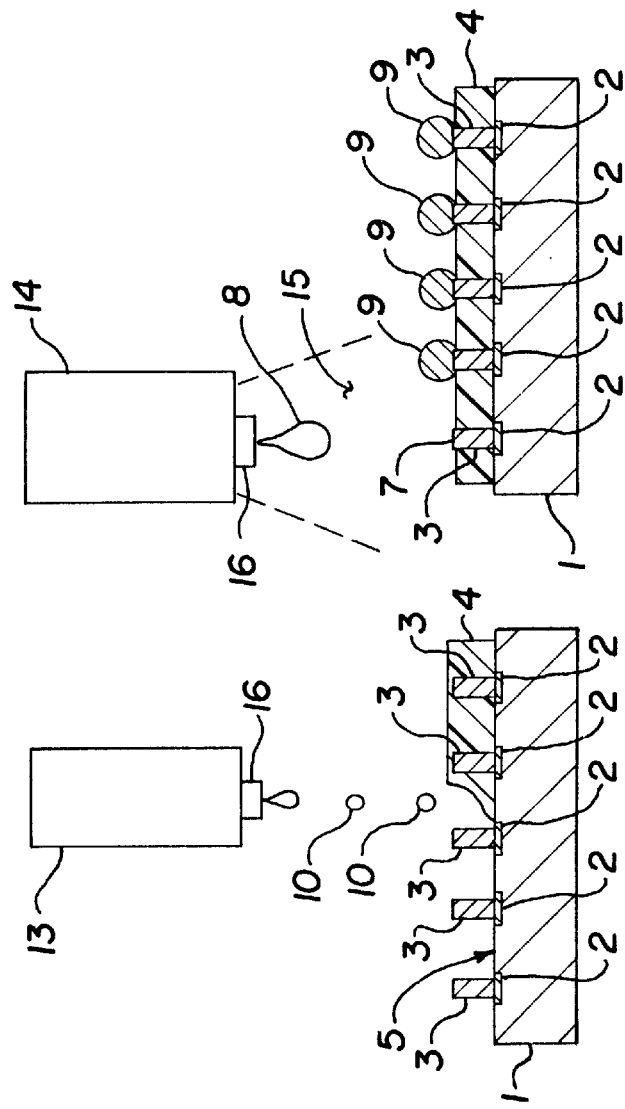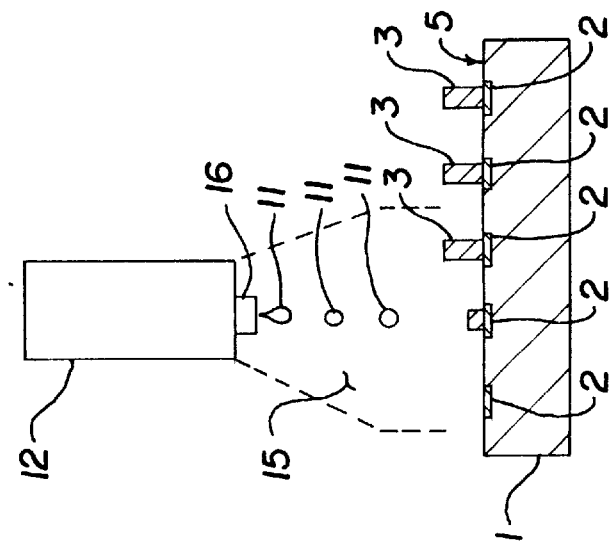

METHOD FOR PREPARING A CHIP SCALE PACKAGE AND PRODUCT PRODUCED BY THE METHOD

CROSS REFERENCE TO RELATED APPLICATION

This application is the continuation-in-part of application Ser. No. 60/035,305 filed Jan. 11, 1997 by the same inventor entitled Method of Fabrication of a Chip Scale Package Using Jetting Technology.

BACKGROUND OF THE ART

1. Field of the Invention

The present invention relates generally to micro-electronic packaging, especially methods of manufacturing chip scale packages for high density integrated circuits with the aid of printing technology for printing solder and dielectric polymers.

2. Description of the Prior Art

The electronic package serves many purposes from protecting the integrated circuit (I.C.) to electrically connecting it to the outside world. Some of the functions that the micro-electronic package performs are: 1.) mechanically supporting the I.C.; 2.) protecting the I.C. from damage of environmental stresses including mechanical stress, thermal stress, stress induced by gain or loss of moisture, etc.; 3.) removing thermal energy created in the I.C.; 4.) connecting the I.C. to the outside world with the necessary inputs, outputs, grounds and power connections; 5.) shielding the surroundings from EMI created on the chip or created by the package leads; and 6.) minimizing overall size depending upon the application requirements.

A conventional method of packaging utilizes lead frames and strips having a die bonding center surface surrounded by leads. Curable adhesive is placed on the bonding surface of the lead frame and the integrated circuit chips pressed into the adhesive and subsequently cured to secure the chip to the frame. A similar process is also done on elongated printed circuit boards or ceramic substrates with conductors. Conventional processing further includes a wire bonder where tiny wires from pads on the chip are connected to the leads and the lead frame for electrical interconnects. Still further processing runs the lead frame to another machine called a mold machine which molds a plastic around and over successive chips to protect them. After the strip comes out of the mold machine, individual micro chips are trimmed out of the lead frame with electrical leads extending from the plastic shell. This process and an improvement thereof is discussed in U.S. Pat. No. 5,681,757.

The increase in the number of inputs and outputs and higher speed operations have driven the semiconductor packages to Array Bonding where the interconnect pads are spread out over the surface of the integrated circuit. The number of input-outputs and the high frequency operations of the main drivers of Array Bonding. In order to meet these requirements, integrated circuit packages are getting smaller, with interconnects covering the bottom surface of the package. Various types of packages exist, including Ball Grid Arrays, Micro Ball Grid Arrays, Flip-Chip, and Chip Scale Packages.

The prior art uses standard semiconductor and micro-electronic packaging technologies to reduce the size of the existing semiconductor package and create shorter interconnects. The prior art divides the semiconductor wafer into individual integrated circuits and then packages integrated circuits individually. Typically, the integrated circuits are placed in a package and sealed for protection. The best chip scale packages produced by prior art methods are 20% or more larger than the chip. As the devices get smaller and smaller, it would be advantageous to build the package directly onto the semiconductor wafer and then divide the wafer into individual semiconductors. The package would be no larger than the chip itself except in the thickness dimension. The prior art does not print the package directly onto integrated circuit chips or the semiconductor wafer. It would be highly desirable to provide a method based on printing technologies to print the package directly onto the semiconductor wafer. An object of the present invention is to provide such a packaging technology.

SUMMARY OF THE INVENTION

The present invention is a method of preparing a chip scale package for high density integrated circuits where the method of manufacturing utilizes printing both solders and polymers. The printing technology used is based upon ink jet printing technology. Although the process can be used with a bare integrated circuit chip, it is preferably applied to a wafer having a multiplicity of chips therein.

A chip scale package for microelectronic devices having a connection surface and a plurality of exposed interconnect pads on the connection surface is prepared by providing a solder jetting means (printhead) capable of jetting droplets of molten solder through a protective atmosphere toward the interconnect pads on the connection surface. A column of solder is built on each pad from drops jetted from the solder jetting means. Solder columns are built to the desired height by depositing and freezing at least one droplet on a pad and then successively depositing additional droplets on previously deposited droplets to form an integrated column. The columns extend preferably perpendicularly away from the interconnect pads to about the same height. Stepping is used to relatively move the part or the jetting device to build additional columns on each succeeding pad until an array of columns is built on an array of pads.

In one embodiment, the connection surface and array of columns are covered with a layer of dielectric to a thickness greater than the height of the solder columns. This dielectric layer can be made by means of conventional techniques such as screen printing or spin coating but is preferably done with a solder jetting device having a polymer reservoir. The protective layer of dielectric material on the connection surface is preferably produced by operating a second printhead (dielectric jetting means) and creating relative movement between the connection surface and the printhead until the solder columns are covered with dielectric. Enough of the top of the layer of dielectric material is removed to expose the outer ends of the solder columns. A solder bump is then printed on the outer end of each solder column to serve as a basis for an electrical connection between the pads and a substrate or another device.

An alternate method of preparing a chip scale package varies from the preceding process by covering the connection surface with a layer of dielectric produced from consolidated droplets of dielectric material deposited by a dielectric jetting means wherein the dielectric layer has a thickness less than the height of the columns whereby each column has an end portion exposed above the layer. The dielectric layer is then cured and the end portions of the solder columns are subjected to solder reflow temperature conditions for sufficient time to convert the exposed end portions of the columns into consolidated individual bumps that can be used in a further assembly solder reflow operation to make electrical connections with the pads on the chip through said bumps.

In a variation, a dielectric layer can be deposited on the connection surface over the pads prior to forming solder columns. In this variation, an opening can be ablated through the dielectric layer to expose the pad underneath. A solder jetting device can then be stepped over each opening in turn whereby droplets of solder are directed into the opening to create a column using the opening in the dielectric layer to serve as a mold which defines the size and shape of the solder column. In a further variation, a plated metal coating can be applied over the solder columns before the dielectric layer is jetted. The metal coating improves conductivity and durability of the vertical interconnects.

The process of preparing a chip scale package can also produce connections for pads that are too close to bump. Vertical solder columns are created on the connection surface, a first dielectric layer applied and the ends of the solder columns exposed as previously described. A solder jetting means is positioned for jetting droplets of molten solder through the protective atmosphere onto the end of the formed solder column. The solder jetting means and connection surface are moved relative to each other an a plane parallel to the dielectric layer while operating the jetting means whereby the formed solder column is continued about a right angle to itself along the surface of the dielectric layer to an end point. Stepping is used to position similar laterally extending extensions in a desired direction from the other solder columns previously created on the pads. A further second vertical column of solder is built on the lateral extension by the solder jetting means, preferably at the end thereof, to a further desired height. Each further column is offset from the previously formed vertical solder column extending from its pad. The upper surface of the first layer of dielectric is covered with a second layer of dielectric preferably produced from consolidated droplets of dielectric material deposited by the dielectric jetting means. The ends of the second column of solder extending vertically through the second dielectric layer are exposed and provided with a connection means in order to make electrical connection with the pads.

The invention makes direct printing in wafer format possible advantageously moving the packaging operation into the front-end of the semiconductor operation. Solder and polymer dielectric droplets are applied directly to the electrical contact surfaces without the necessity for anything contacting or touching the critical connection surface. The process of preparing the chip scale package is entirely a data driven process alterable by changing the instruction set to control the movement of the parts and operation of the jetting device. Very small packages can be created no bigger than the integrated chip itself. There is a certain amount of flexibility added to the electrical connections by the solder columns, which improves reliability of the device. The method makes it possible to have a very high input/output count on a given chip package and the potential for lower cost than other packaging operations.

BRIEF DESCRIPTION OF THE DRAWINGS

FIG. 1a is a perspective view of a bare integrated circuit chip showing a connection surface having a plurality of metalized bond pads otherwise referred to as interconnect pads or just pads;

FIG. 1b is the chip of FIG. 1a showing a solder column deposited on each interconnect pad which extends away from the connection surface;

FIG. 1c shows the chip of FIGS. 1a–b after a dielectric material has been applied to cover the array of solder columns on the pads. A schematically shown laser ablation device operates on the resulting surface;

FIG. 1d is the chip of FIG. 1c after the top layer of the dielectric has been removed to expose the end of each solder column;

FIG. 1e is the modified structure shown in FIG. 1d wherein each of the exposed ends of the solder columns have been connected with a solder bump extending from the ablated surface;

FIG. 2a is cross section through the bare integrated chip of FIG. 1a through a row of pads;

FIG. 2b is a cross section through the row of pads after solder columns of FIG. 1b have been deposited.

FIG. 2b1 shows a coating on the connection surface which is removed after a metal coating is applied by electroplating.

FIG. 2c shows embedded solder columns in the structure of FIG. 1c;

FIG. 2d is the structure of FIG. 2c after the dielectric coating is partially ablated away to expose the column ends;

FIG. 2e is a cross section through the structure of FIG. 1e after the a solder bump has been deposited in communication with the end of each solder column along the row;

FIG. 2f is the structure of FIG. 2b with an alternate metallic coating applied over the surface of the solder columns;

FIG. 2g is the structure of FIG. 2f with a layer of dielectric on the connection surface and the ends of the metallic coated solder columns exposed in the manner of FIG. 2b;

FIG. 2h shows an alternate version of the bare integrated circuit chip through a row of pads after a layer of dielectric has been applied to the connection surface and micro-vias, which are preferably cone-shaped openings, are formed in the dielectric layer to expose the surface of the pads;

FIG. 2i is the structure of FIG. 2h after solder is printed into the openings in communication with the pads;

FIG. 3a is a section through the integrated circuit with a schematically illustrated solder jetting device jetting droplets of solder through an inert atmosphere to form the columns of FIG. 1b and FIG. 2b as a step and repeat;

FIG. 3b is a view of the completed FIG. 3a showing a subsequent operation where another solder jetting device is printing droplets of dielectric coating on the connection surface corresponding to the structure seen in FIGS. 1 and 2c;

FIG. 3c is a cross section through the completed FIG. 3b after the surface of the dielectric has been removed showing a solder jetting device printing larger drops of solder on the end of each column to form a bumped column on the connection surface;

FIG. 7b illustrates solder columns printed on the connection surface of the microelectric device of FIG. 7a;

DETAILED DESCRIPTION OF THE PREFERRED EMBODIMENT

Figure 1:
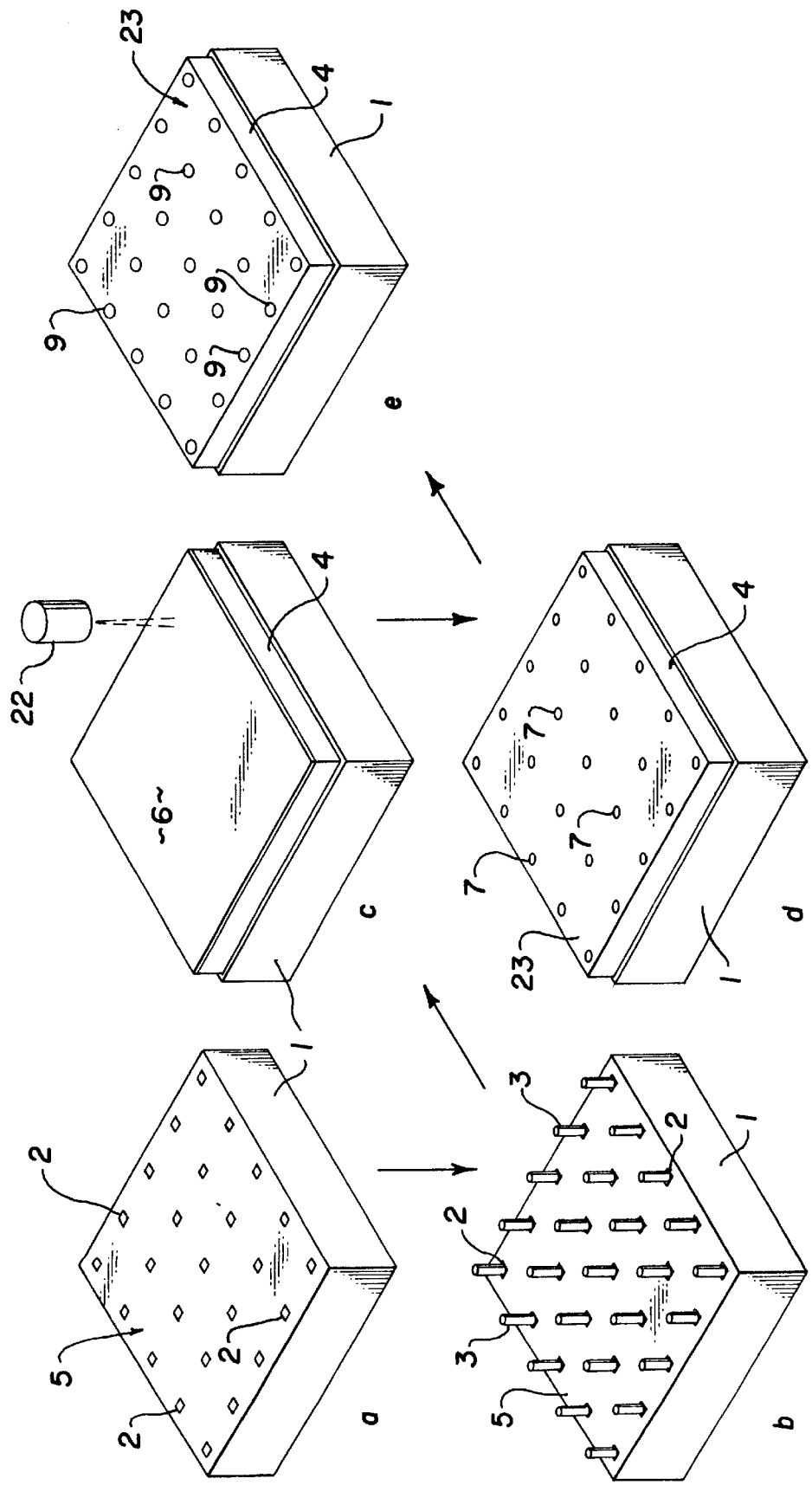

In the description that follows, like elements will be referred to by the same reference numeral. The invention herein is predicated on the concept of using Micro Jet Printing Technology (based upon ink jet printing), which has been modified in various ways to deposit solder and dielectric polymers in a highly controlled manner on a microscopic scale. Solder and dielectric materials can be applied by a printhead at a high rate of speed controlled by applied voltage pulses at a selected electrical frequency and delay time. This type of printhead is disclosed in U.S. Pat. Nos. 5,193,738, 5,229,016, 5,377,902 and in U.S. patent application Ser. No. 08/581,273, filed Dec. 29, 1995 (Printhead for Liquid Metals and Method of Use), and their entire disclosures are hereby incorporated by reference. These same devices can be employed to deposit flowable polymer materials which can be deposited as droplets from a heated printhead of the above references or in the manner of U.S. Pat. Nos. 5,415,679 and 5,707,684 also incorporated by reference. Multiple solder jetting printheads can be arranged to deposit solder or organic dielectric materials as indicated in U.S. Pat. No. 5,686,757 incorporated herein by reference.

The printhead may be referred to as a solder jet printhead or a solder jetting device, but it is to be understood that the same kind of device, perhaps with some modifications with respect to orifice size and operating conditions is used to print droplets of dielectric material as well as solder. Elevated temperature reduces fluid viscosity making it possible to print drops of a wide variety of polymer materials. The invention contemplates the use of at least one solder jetting device to build solder columns and a second solder jetting device for jetting dielectric materials. The usual solder is a 63/37 eutectic solder melting at about 185° C. which is jetted from the solder jetting device at a temperature of typically 220° C. to a substrate typically 75° C. Other solders and metal alloys could be used.

The first embodiment can be understood from the process steps illustrated in FIG. 1 and FIG. 2. The views of FIG. 2a–2e are cross sections through the integrated circuit chip of FIGS. 1a–1e in its various stages of progression.

FIG. 1a shows a bare integrated circuit chip 1 with an array of metalized bond pads 2 which may be referred to herein as interconnect pads or just pads. The plurality of interconnect pads are arrayed on a connection surface 5. Pads and solder alloy must be compatible with each other. Examples of pad metallization acceptable for solder bonding are known in the industry. Typical semiconductor solder bumping processes start with an aluminum pad covered with an adhesion layer (examples: Ti—W or Cr) followed by a layer of metal that can be soldered to. In addition to the adhesion layer, the following exemplary layer sequences are often used: Cu or Ni or Ni+Au or Cu+Ni+Au or Cu+Au or Cu+Pd or Cu with a very thin organic coating. The examples given have been demonstrated with solder jet. In all cases, the gold (Au) layer was a very thin (flash) layer deposited to keep the surface from oxidizing. With proper process control, it will not be necessary. Individual semiconductor manufacturers would use their own proprietary formulations and processes.

In FIG. 1b, individual solder columns 3 have been deposited or printed on the individual pads 2 of chip 1. Columns 3 extend vertically and perpendicularly from pads 2 on connection surface 5 as seen in FIG. 2b. They are preferably produced to the same height above connection surface 5 by the preferred printhead disclosed in U.S. patent application Ser. No. 08/581,273 mentioned above.

FIG. 3a schematically illustrates formation of the individual solder columns 3 on pads 2. Solder jetting device 12 is preferably a drop on demand device which ejects droplets 11 from a jet 16 having a tiny orifice. Droplets 11 are protected by an inert atmosphere 15 indicated by dotted lines. These droplets are directed serially in turn to each of the pads 2. The preferred printhead mentioned above can provide the inert atmosphere from one or more circumferential orifices around jet 16 or the operation can be conducted in a controlled atmosphere chamber. Inert atmosphere prevents oxidation of the solder which among other things can interfere with jetting of the droplets.

Device 12 is positioned over a pad 2 and a stream of successive solder droplets are directed toward pad 2. The first solder droplet to strike pad 2 will freeze since the pad temperature is kept lower than the melting point of the solder. The next droplets will impact the first drop and also freeze as successive drops are deposited to build up the solder column. The diameters of the solder columns can be from 10 to 100 percent wider than a droplet diameter depending upon various jetting parameters and temperature. Solder columns have been built with 4 to 25 or more droplets of solder being deposited upon the given pad 2. Once the solder column shown has been built to the desired height, printhead 12 is stepped to the final pad position of FIG. 3a. Alternately, chip 1 is stepped under the stationary printhead 12.

FIG. 3b illustrates the preparation of the FIG. 1c structure. In FIG. 3b a dielectric jetting means 13 is seen dispensing droplets of polymer 10 from a jet 16 which may have a larger orifice than device 12 to emit droplets of polymer dielectric. The individual droplets 10 of preferably heated polymer dielectric from jetting means 13 are consolidated by flowing together to form a layer of dielectric 4 around columns 3. In FIG. 3b the layer 4 being formed is slightly thicker than the height of solder columns 3 on pads 2. Relative motion is continued between integrated circuit chip 1 and printhead 13 until the layer of dielectric material covers connection surface 5, as seen in FIG. 1c. Many of the polymers jetted don't require a special inert environment. The types of polymers that could be used are covered in U.S. Pat. Nos. 5,498,444 and 5,707,684 which were incorporated by reference. After printing, the polymers are cured by the appropriate means if necessary.

The next step is removal of a top portion of layer 4 to expose the top ends 7 of solder columns 3. In FIGS. 1c and 2c, dielectric layer 4 has a top surface 6 which lies above the tops of solder columns 3. A conventional laser ablation means 22 is shown schematically in FIG. 1c directing laser energy to and against surface 6 after it has been cured thermally or by ultraviolet or other means. Dielectric layer 4 remains intact to protect chip 1 from the outside environment. Laser ablation, particularly with the preferred excimer laser, is shown in U.S. Pat. Nos. 5,208,980 and 5,703,631 which are incorporated by reference.

A portion of dielectric layer 4 is removed sufficient to expose the outer end of each solder column 3 is shown in FIG. 1d. This works because the laser ablation rate of polymers is much much greater than that of metal. Dielectric surface 6 is removed until an ablated surface 23 seen in FIG. 2d is created slightly below the top 7 of each column 3. The laser ablation process will also clean off top 7 of each column 3 to expose uncontaminated solder. Now chip 1 is ready for the final step.

FIG. 3c shows the printing of larger solder droplets 8 which are directed to the exposed ends 7 of solder columns 3 to produce solder balls 9 which fuse to the columns 3 to provide an electrical connection with pads 2. These solder balls 9 are "bumps" which may be the same solder alloy as solder columns 3 or they may be a different composition than the composition of the solder columns. If solder bumps 9 are a lower melting composition, for example, they could be used to "bump" the chip at a temperature below the melting point of the solder columns.

FIGS. 1e and 2e show the resulting finished structure wherein the solder balls 9 constitute "bumps" which may be used in flip-chip fabrication to connect pads 2 to an array of electrical contacts on a substrate. Solder jetting means 14 is a printhead like that of jetting device 12. Operating parameters are mainly voltage and timing of the voltage pulses applied to a piezoelectric or electrostrictive device within the printheads 12, 14. A larger orifice diameter in jet 16 is known to produce a substantially larger droplet. Recently, ways to produce significantly larger droplets from the same orifice size in a similar printhead design has been demonstrated by manipulating the electrical input to the transducer of printhead 12, 14. This procedure is described in pending application Ser. No. 08/940,731, filed Sep. 30, 1997, entitled "Extended Transition Time Waveform for Drop Size Modulation". It has also been demonstrated that larger solder spheres can be produced by depositing multiple droplets at higher frequencies to a given location. In this way the droplets all hit the end of the column before freezing takes place thus producing a larger sphere.

FIGS. 2b1, 2f and 2g represent a variation of the process of FIGS. 1 and 2. After solder columns 3 are formed on pads 2 in FIGS. 1b and 2b, a plated layer 24 of metal, preferably copper, is applied by electroplating copper onto the solder columns 3 of integrated circuit 1 before the dielectric layer is applied. This would increase the conductivity and durability of the vertical interconnects. The plating needs (metal, thickness, etc.) are determined by the specific application. FIG. 2b1 shows the structure of FIG. 2b after a photoresist layer 74, for example, is applied to connection surface 5. A thin flash layer of metal (not shown) lies under the photoresist coating to aid in the plating process. FIG. 2f shows the plated metal 24 deposited on solder columns 3 after the photoresist layer and the flash layer have been dissolved or otherwise removed. FIG. 2g shows the structure of FIG. 2f after a dielectric layer 25 has been deposited, coalesced, and cured in the manner previously described. The plated tops of columns 3 are exposed to receive solder bumps 9. The plating of copper onto metal pads is commonly used today in the semiconductor industry. In this variation, we are preforming a plating operation after the solder columns have been printed onto the pads.

FIG. 2h is a variation of the process of FIGS. 1 and 2 in which dielectric layer 27 having top surface 18 is applied by printhead 13 over connection surface 5 and pads 2. In this approach, vias, shown here as blind cone shaped openings 26, are formed into dielectric layer 27 down to the surface of pads 2. These vias can be formed by photolithography techniques or preferably by laser ablation methods. The vias are preferably, but not necessarily, cone shaped. They can be nearly square, columnar or oblong, for example. The formation of blind vias to expose and interconnect to pads below is routinely used in the microelectronics industry. Filling vias with solder jet technology is unique.

By reference to FIG. 2i, once vias 26 are formed, solder can be accurately printed into the vias with a solder jetting device 12. Accurate filling of vias down to about 75 $\mu$m could be accomplished using solder droplets on the order of 50 $\mu$m and smaller vias could be filled using smaller droplets. FIG. 2i illustrates sequential droplets from jetting device 12 have filled each via with a cone shaped solder column 28 in which the vias act as molds to define the column.

Figure 4A:
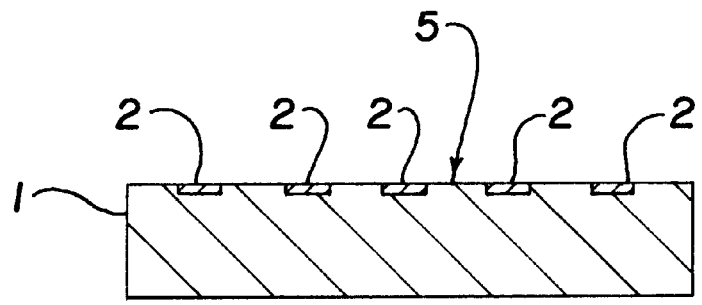
FIG. 4a is a transverse section through a row of pads on a bare integrated circuit.
Figure 4B:
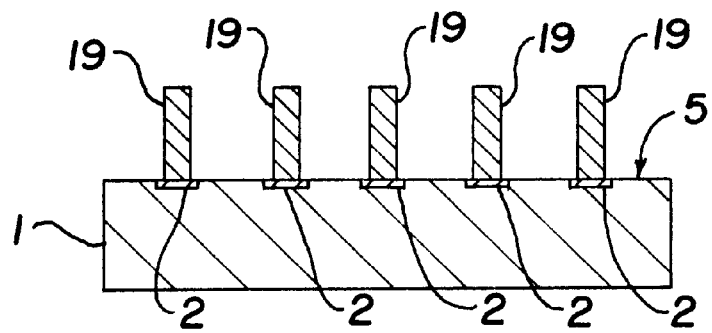
FIG. 4b is the structure of FIG. 4a with a column of solder printed on each of the pads.
Figure 4C:
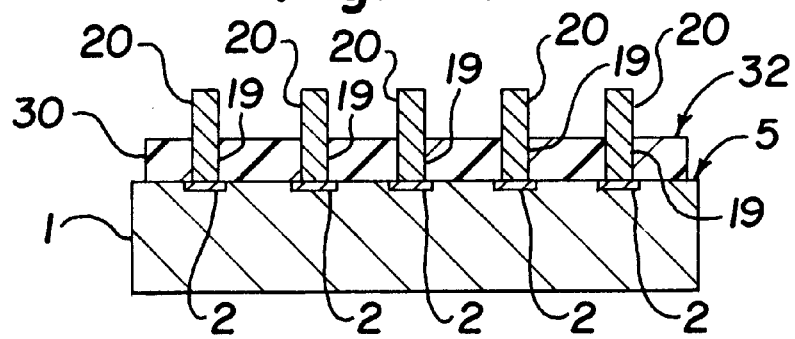
FIG. 4c illustrates a dielectric layer printed on the connection surface to a level which leaves a substantial extended portion of each solder column exposed.
Figure 4D:
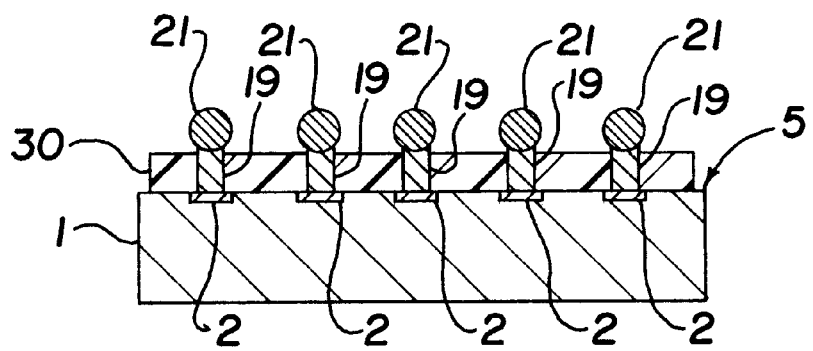
FIG. 4d shows the structure of FIG. 4c after exposure of the column extensions to a source of heat sufficient to create solder reflow conditions which form column material into bumps.

FIGS. 4a–4d illustrate a variation of the process disclosed in FIGS. 1–3. FIG. 4a is the bare integrated circuit chip of FIGS. 1a and 2a. Tall solder columns 19 are printed by solder jetting device 12 as in FIG. 3a on pads 2. In FIG. 4c, a dielectric layer 30 is printed as in FIG. 3b to a level that covers only part of columns 19. Part of columns 19 is designated as the upper part 20 above surface 32 of dielectric layer 30. The end portions 20 of columns 19 are exposed to solder reflow temperature conditions for sufficient time to convert the exposed end portions 20 of column 19 to consolidated individual bumps 21 seen in FIG. 4d that can be used in a further solder reflow assembly. Careful control of the temperature and time of exposure allow the effects of surface tension to draw the partially melted column parts 20 into generally spherical shapes 21 that can be used for bumping the part. The bottom part of the column 19 within dielectric layer 30 is surrounded by the dielectric so it remains in place during the reflow melting operation.

Figure 5:
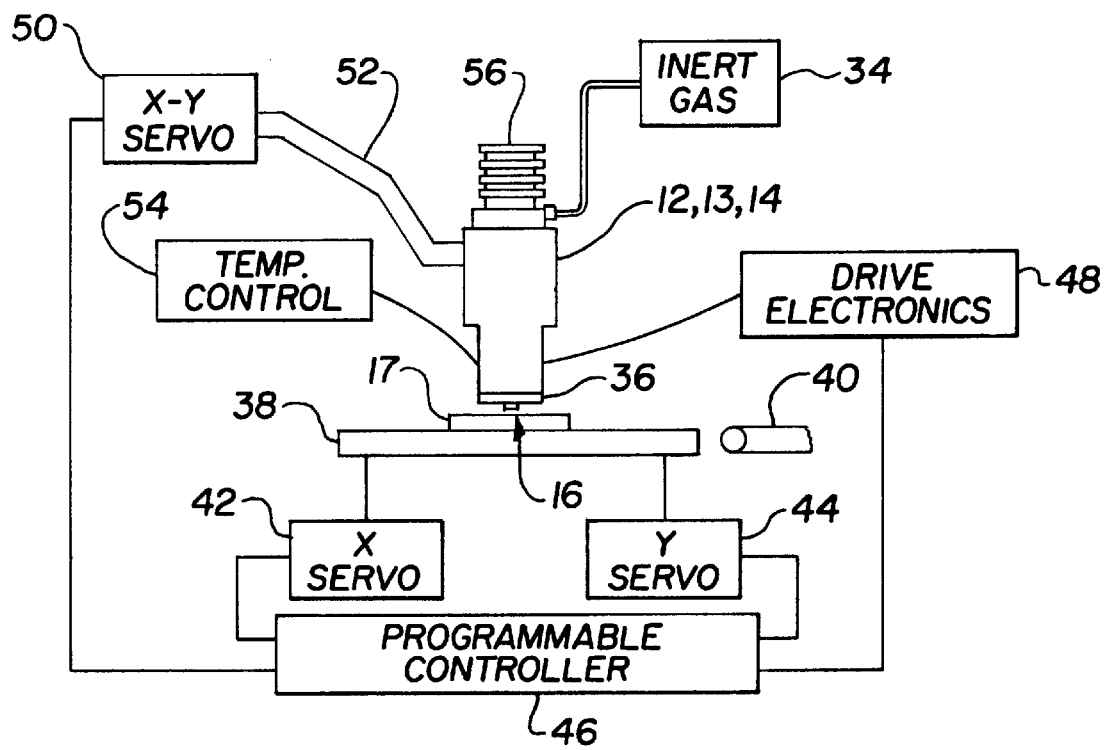
FIG. 5 is a schematic illustration of the solder jetting system used in FIGS. 3a–c.

FIG. 5 is a schematic diagram of the solder jetting system described particularly in pending U.S. patent application Ser. No. 08/581,273 mentioned previously. Printhead 12, 13, 14 is provided with a controlled supply of inert gas 34 which may be heated and circumferentially distributed by the front 36 of the printhead around jet 16 where the drops emerge. A blanket of inert gas is trapped between front 36 and wafer 17 positioned on X-Y table 38. An infeed or outfeed device 40 is schematically illustrated to supply or remove wafer 17 from table 38. X servo 42 and Y servo 44 are operatively connected to and operated by programmable controller 46. Programmable controller 46 is also operatively connected to drive electronics 48 which in turn is connected to the transducer within the printhead which is driven by voltage pulses at a selected frequency and time sequence. Programmable controller 46 may also be connected to X-Y servo 50 which is operatively connected to a movable arm 52 which supports the printhead. This illustrates that either the printhead can be moved relative to the part or the part can be moved relative to the printhead in a step and repeat. A separate temperature control unit 54 is operatively connected to heating elements within the printhead to maintain solder in a molten condition. The temperature control may be separate as indicated or operatively connected to programmable controller 46. A removable cap 56 permits loading or unloading solder or polymer for jetting.

Figure 6:
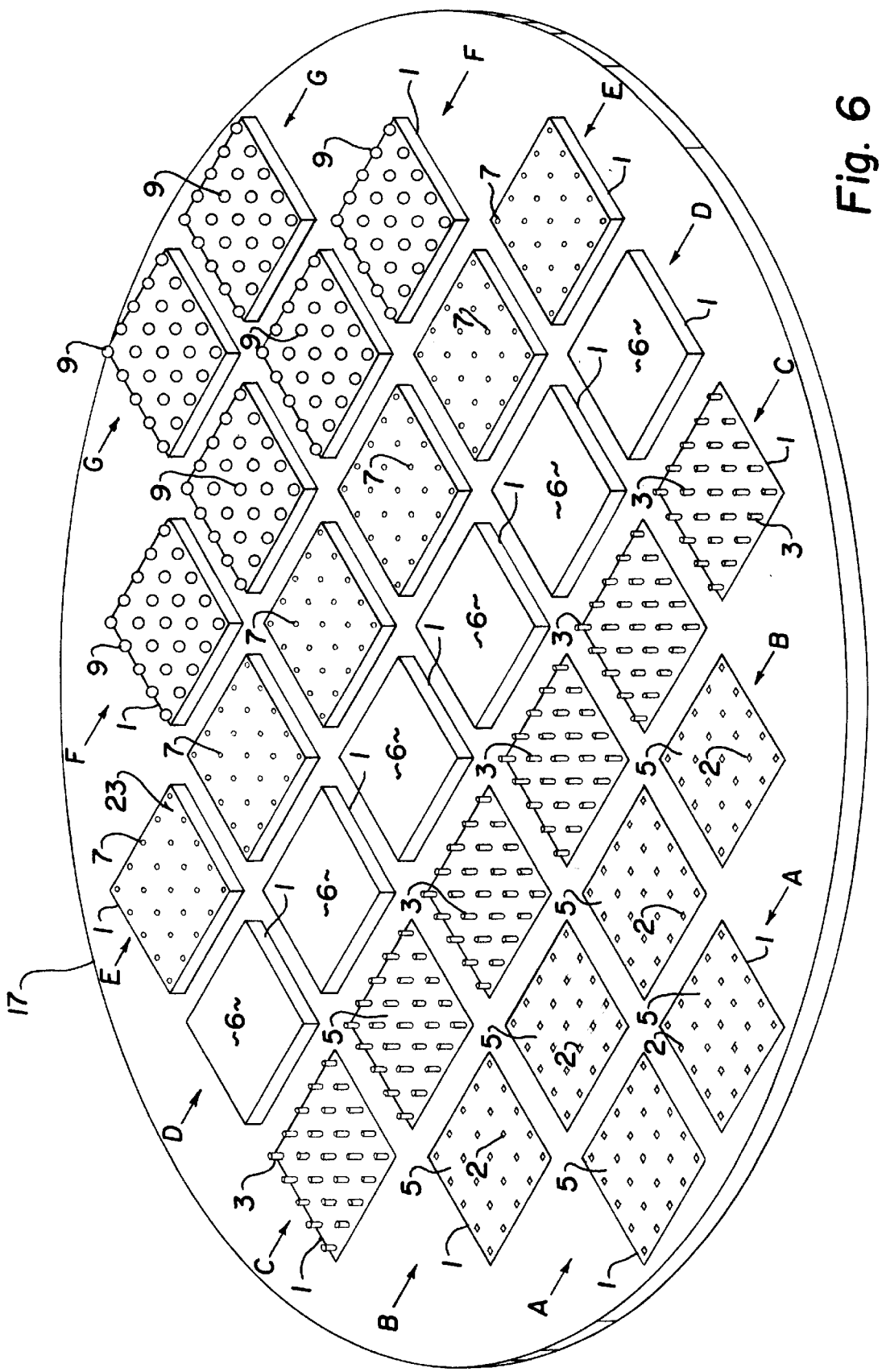
FIG. 6 shows a plurality of connecting surfaces of integrated circuits in wafer form showing all the steps of the process of FIG. 1 in all stages of completion before the integrated circuits are separated from the wafer.

FIG. 6 illustrates completing all the steps set forth in FIGS. 1 and 2 while the integrated circuits are still in the wafer 17 format. Only a few of the reference numerals will the used as it is evident that the surface of wafer 17 contains a plurality of integrated circuits 1 each having a plurality of pads 2 arranged in array on connection surface 5. The remainder of this discussion will pertain to the diagonally oriented rows of integrated circuits 1 in FIG. 6 by reference to FIG. 1. Row A contains 2 and Row B contains 4 integrated circuits with connection surfaces 5 and a plurality of pads 2 arranged in array shown in FIG. 1a. Row C shows the addition of a plurality of solder columns 3, each on a pad 2, to represent the step of FIG. 1b. Row D represents 6 integrated circuit chips 1 after dielectric layer 4 has been laid over connection surface 5 and columns 3 of Row C to depict the step of FIG. 1c. Row E represents 6 integrated circuits after laser ablation of surface 6 to represent the step of FIG. 1d. Row F represents 4 and Row G represents 2 integrated circuit chips on the surface of wafer 17 to show the finished chip scale package of the step of FIG. 1e whereby solder balls 9 to serve as bumps have been deposited on ends 7 of columns 3. In FIG. 6 the pad 2 sizes would be in the range of 40–150 µm.

For illustration purposes, FIG. 6 shows all 5 stages of the process of FIG. 1 on a single wafer 17. In actual practice, the entire wafer would move from one process step which would be completed on all integrated circuit chips before moving to the next process step. A production process may require 3 printing platforms and 1 laser ablation platform and the means to sequence wafers between the platforms. Importantly, this is the only chip scale package that can be constructed directly in wafer format. After all the devices reach the final stage, the wafer may be separated into individual chips 1 by sawing the wafer to separate the individual chips.

Figure 7A:
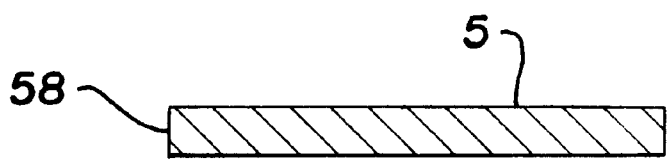
FIG. 7a is a schematically indicated transverse section through a connection surface to illustrate an alternate process.
Figure 7B:
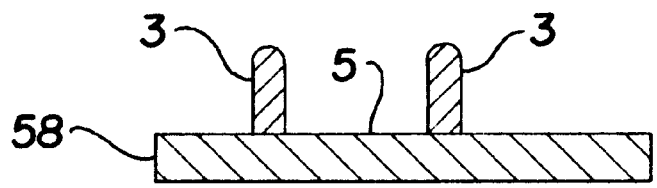
Figure 7C:
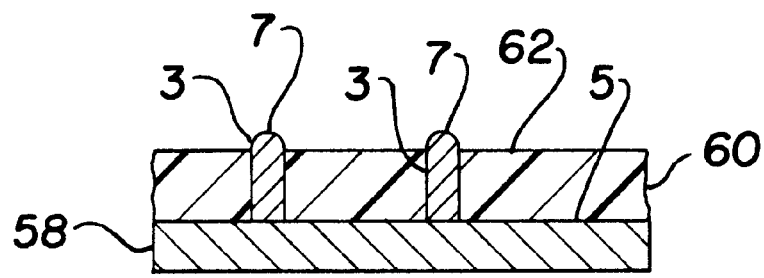
FIG. 7c illustrates the deposit of a layer of dielectric coating on the connection surface of the previous Figure.

FIGS. 7a–7e illustrates how 3-dimensional interconnect structures can be fabricated using solder jet technology. FIG. 7a represents a microelectronic substrate 58 having a connection surface 5. FIG. 7b illustrates the deposition of multiple solder columns 3 by means of solder jet technology each of which are resting on a pad (not shown). In FIG. 7c a dielectric layer 60 has been applied to the upper surface of device 58 enclosing the solder columns 3 except for the exposed top end 7. This can be done by over filling then ablating away a portion of the upper surface. After curing the dielectric, the process is continued in FIG. 7d.

Figure 7D:
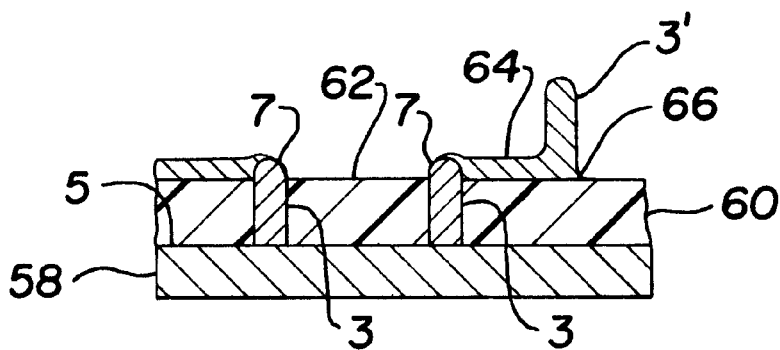
FIG. 7d illustrates the continuation of the columns of FIG. 7c in a lateral direction then in a vertical direction.
Figure 7E:
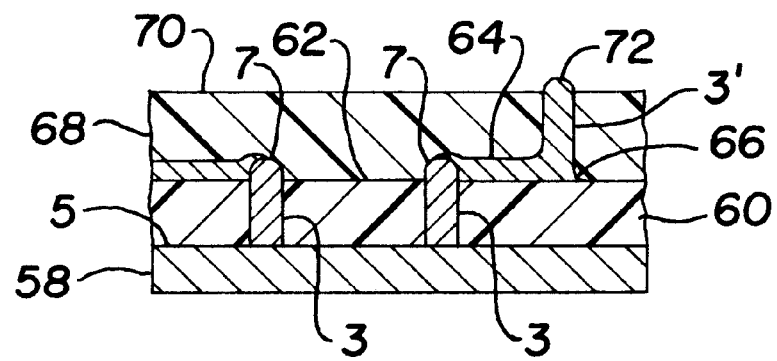
FIG. 7e illustrates the deposit of a second dielectric layer over the laterally displaced continuation of the FIG. 7d solder columns with the terminal end of the columns exposed for bumping.

In FIG. 7d the solder jetting means is positioned over exposed top end 7 of each solder column and operated to begin jetting droplets of molten solder through a protective atmosphere. The solder jetting means is moved relative to connection surface 5, or micro-electronic device 58 is moved relative to the solder jetting means in a direction generally parallel to connection surface 5 while operating the jetting means whereby the previously formed solder column 3 is continued laterally as a lateral extension 64 along dielectric surface 62 to an end point 66. Lateral extension 64 is an extension of column 3 at about a right angle to itself. Relative movement between chip 58 and solder jet 12 is stopped and the solder jet builds a second vertical column 3' as a vertical extension parallel to column 3 and perpendicular to surface 5. This is seen in FIG. 7d.

To the structure of 7d, a second layer of dielectric 68 is jetted onto surface 62 of dielectric layer 60 covering the newly added vertical solder column 3' to a top surface 70 which is below upper end 72 of laterally extended columns 3, 64, 3'. Dielectric layer 68 may be cured and then end 72 positioned under solder jet device 14 to deposit a solder ball 9 thereon. This provides a connection means at the end of each offset column 3, 64, 3' in order to make electrical connection with the pads on device 58. This technique is especially valuable where the pads under column 3 are too close together and must be extended laterally in order to provide enough room so that solder balls 9 deposited on the end of adjacent ends 72 of the offset column are far enough away from each other so that there is no physical or electrical interference between them.

In best mode a 63/37 tin/lead solder which melts at about 185° C. is heated to about 220° C. for jetting. A typical range is about 200–230° C. with the substrate heated within a range of about 25° to 150° C. A typical substrate temperate is about 75° C. The effect of temperature is somewhat complex because both the jetted droplet temperature and substrate affect the freezing process, as does the size and rate of the drops and the distance they travel after leaving the orifice in the printhead. Generally things that reduce the freezing rate tend to create a column that is wider and not as tall. If a longer time is provided between drops (normal operation is around 200 drops per second) the preceding drops have more time to freeze before the next drop arrives. This tends to build a narrower taller column. If the drop temperature is higher or there is less time between drops, the column tends to be fatter and lower. If the drops are very close together in time, they will solidify into one big ball of solder. The effect of higher velocity is a tendency to spread the column a little more giving a fatter column. Typical velocity is about 1 meter/second. A velocity range of 0.5 to 3.0 m/sec has been demonstrated.

The polymer selected should absorb UV energy in order to be ablated by a laser, at least for the first embodiment of the invention. The polymer is jetted in the liquid state and must solidify or be cured after the drops reach the surface of the chip. Normally the polymer would be selected to cure with thermal energy (such as an epoxy) or be cured by exposure to ultraviolet radiation (such as UV curable polymers). The polymers should have heat resistance to solder reflow conditions.

Surprisingly, it was easier to build the solder columns than was expected. The highest resolution demonstrated for solder is represented by an example where 25 µm diameter columns were built on 50 µm centers to a height of more than 200 µm. Columns that were 50 µm on 200 µm centers have also been demonstrated. Typical size and spacing is columns about 100 µm wide on 250 µm centers. Drop sizes of about 18 µm to 120 µm at velocities of about ½ to 3 m/sec at up to 500 Hz have been demonstrated. Typical orifice sizes are about 15 µm to 90 µm for solder.

The highest resolution demonstrated for polymer dielectric is about 40 µm on 50 µm centers at a frequency greater than 2000 Hz. Polymer temperatures from room to 200° C. have been demonstrated from orifices ranging between about 25 µm to about 70 µm. The use of multiple jetting devices is particularly well suited to jet polymer layers and have been used. These examples are presented to provide some idea of the many variations that have been encountered in reducing the invention to practice, but not by way of limitation.

Although the invention has been disclosed above with regard to a particular and preferred embodiment, which is advanced for illustrative purposes only, it is not intended to limit the scope of this invention. For instance, although the inventive method has been set forth in a prescribed sequence of steps, it is understood that the disclosed sequence of steps may be varied. It will be appreciated that various modifications, alternatives, variations, etc., may be made without departing from the spirit and scope of the invention as defined in the appended claims.

I claim:

1. A method of preparing a chip scale package, comprising:
    providing a microelectronic device having a connection surface with a multiplicity of exposed interconnect pads;
    providing solder jetting means for jetting droplets of molten solder through a protective atmosphere toward individual interconnect pads on the connection surface;
    operating said jetting means to direct droplets of molten solder toward one individual pad;
    building a column of solder to a desired height on said one individual pad by depositing and freezing one or more successive droplets on said one individual pad and on successively deposited droplets thereon whereby said pad can be electrically connected at a distance through a connection to said column.

2. The method of claim 1 further including the steps of:
    stepping the solder jetting means with respect to the microelectronic device to direct droplets of molten solder toward successive individual pads;
    building a column of solder to the desired height on successive individual pads by depositing and freezing one or more successive droplets on each successive pad and on successive droplets deposited thereon before stepping to the next successive pad;
    whereby pads on which said columns are built can be electrically connected at a distance by means of said columns.

3. The method of claim 2 further including the steps of:
    covering the connection surface with a layer of dielectric material, said layer having a height less than the desired height of the columns whereby each column has an end portion exposed above said layer.

4. The method of claim 3 further including the steps of:
    providing dielectric jetting means for jetting droplets of dielectric material toward the connection surface; and
    the step of covering the connection surface comprises covering the connection surface with a layer of dielectric produced from consolidated droplets of dielectric material deposited by the dielectric jetting means.

5. The method of claim 3 further including the steps of:
    exposing the end portions of said columns to a solder reflow temperature condition for a sufficient time to convert the exposed end portions of said columns to consolidated individual bumps that can be used in a further solder reflow operation to make electrical connections with said pads through said bumps.

6. The method of claim 4 further including the steps of:
    exposing the end portions of said columns to a solder reflow temperature condition for a sufficient time to convert the exposed end portions of said columns to consolidated individual bumps that can be used in a further solder reflow operation to make electrical connections with said pads through said bumps.

7. The method of claim 2 further including the steps of:
    covering the connection surface and solder columns with a layer of dielectric material, to a height sufficient to cover the solder columns despite any irregularities in the thickness of the dielectric layer.

8. The method of claim 7 further including the steps of:
    providing dielectric jetting means for jetting droplets of dielectric material toward the connection surface; and
    the step of covering the connection surface comprises covering the connection surface and solder columns with a layer of dielectric material deposited by the dielectric jetting means to a height sufficient to cover the solder columns despite any irregularities in the thickness of the deposited dielectric layer.

9. The method of claim 8 further including the steps of:
    removing a portion of the dielectric layer sufficient to expose the outer end of each solder column; and
    printing a solder bump on the outer end of each solder column to serve as the basis of an electrical connection with another device.

10. The method of claim 9 wherein the step of removing a portion of the dielectric layer is performed by a laser ablation technique.

11. The method of claim 7 further including the steps of:
    removing a portion of the dielectric layer to expose the outer end of each solder column; and
    printing a solder bump on the outer end of each solder column to serve as the basis of an electrical connection with another device.

12. The method of claim 11 wherein the step of removing a portion of the dielectric layer is performed by a laser ablation technique.

13. The method of claim 2 further including the step of applying a layer of stronger, higher conductivity metal coating to the surfaces of the solder columns to improve strength and increase conductivity of the solder columns.

14. The method of claim 13 further including the step of covering the connection surface and filling the space between the coated solder columns with a dielectric material.

15. The method of claim 14 further including the step of:
    exposing the end of each coated solder column; and
    printing a solder bump on the exposed ends of said solder columns, to provide a means for making an electrical connection with another device.

16. The method of claim 15 wherein the printed solder bump is printed form a solder of different composition than the composition of the solder columns and having a different melting temperature range.

17. The method of claim 7 further including the steps of:
    removing a portion of the dielectric layer sufficient to expose the outer end of each solder column;
    positioning a solder jetting means for jetting droplets of molten solder through a protective atmosphere over a formed solder column and operating said jetting means to deposit solder droplets on said column end;
    moving the solder jetting means and connection surface relative to each other in a plane parallel to the dielectric layer while operating said jetting means whereby said formed solder column is continued at about a right angle to itself along the surface of said dielectric layer to an end point;
    stepping said solder jetting means to a position over another formed solder column and operating said jetting means to deposit solder droplets on said another formed solder column end;
    repeating the previous two steps until the formed solder columns all have a right angle portion and an end point located along the right angle portion; and
    providing connection means at the end points to make electrical connection with the pads.

18. The method of claim 17 including the further steps of:
    sequentially positioning a solder jet means for jetting droplets of molten solder through a protective atmosphere over the right angle portion of those columns that are to be electrically connected;

building a further column of solder on said right angle portions, to a further desired height, each said further column being offset from a previously formed solder column;

covering the layer of dielectric with a second layer of dielectric produced from consolidated droplets of dielectric material deposited by the dielectric jetting means, said layer having a height less than said further desired height; and providing a connection means at the end of each offset column in order to make electrical connection with the pads.

19. A method of preparing a chip scale package for microelectronic devices having a connection surface with a plurality of exposed interconnect pads, comprising:

providing solder jetting means for jetting droplets of solder through a protective atmosphere toward the interconnect pads on the connection surface;

building a column of solder on each pad from drops jetted from the solder jetting means toward the interconnect pads, said columns having a height extending away from the interconnect pads to about the same height;

covering the connection surface with a layer of dielectric to a thickness greater than the height of the solder columns;

removing enough of the layer of dielectric material on the connection surface to expose the outer ends of the solder columns; and converting the outer end of each solder column to a bump to serve as the basis of an electrical connection with another device.

20. The method of claim 19 wherein the outer end of each solder column is converted to a bump by depositing additional molten solder droplets onto the outer end of each solder column.

21. The method of claim 20 wherein the step of depositing additional molten solder droplets is performed by depositing molten solder of a different composition having a different melting point than the solder columns.

22. The method of claim 19 wherein the converting step is performed by partially melting and refreezing the outer ends of the solder columns to form a bump on each column above the layer of dielectric material.

23. The method of preparing a chip scale package, comprising:

providing a microelectronic device having a connection surface with a multiplicity of exposed interconnect pads;

providing solder jetting means for jetting droplets of molten solder through a protective atmosphere toward individual interconnect pads on the connection surface;

applying a layer of dielectric material over the connection surface;

creating blind ended vias over said interconnect pads; and operating said jetting means to create solder columns by jetting molten solder into said vias.

24. The method of claim 23 wherein a solder jetting means is operated to print a solder bump on the top of each of said solder columns.

25. Method of preparing an electronic solder column interconnection, comprising the steps of:

providing an electronic device having a plurality of interconnect pads on a connection surface covered iwth a layer of dielectric material and a plurality of vias within the dielectric layer exposing the intrconnect pads;

providing solder jetting means for jetting droplets of molten solder through a protective atmosphere toward the vias; and operating said jetting means to create solder columns on the interconnect pads by jetting molten solder droplets into said vias.

26. The method of claim 25 wherein a solder jetting means is operated to print a solder bump on top of said solder columns.

27. A method of preparing a chip scale package, comprising:

providing a wafer having therein a plurality of microelectronic devices each having a connection surface and a multiplicity of exposed interconnect pads;

providing a solder jetting means for jetting droplets of molten solder through a protective atmosphere toward individual interconnect pads;

operating said jetting means to direct droplets of molten solder toward one individual pad;

building a column of solder to a desired height on said one individual pad by depositing and freezing one or more successive droplets on said one individual pad and then successively depositing additional droplets on previously deposited droplets whereby said pad can be electrically connected at a distance through a connection to said column;

stepping the solder jetting means with respect to the microelectronic devices to direct droplets of molten solder toward successive individual pads;

building a column of solder to the desired height on successive individual pads by depositing and freezing successive droplets of solder thereon; and applying a dielectric layer to each microelectronic device surrounding said columns.

28. The method of claim 27 further comprising the step of creating a bump above said dielectric layer in electrical connection with the end of each column of solder.

29. The method of claim 28 wherein the step of removing a portion of the dielectric layer precedes the step of creating a bump.

30. A method of making a microelectronic package having multiple electrical interconnections, comprising:

providing a connection surface having a multiplicity of exposed electrical interconnect pads for an integrated circuit chip;

providing a first operable solder jet printhead capable of jetting drops of molten solder on demand;

providing a second operable solder jet printhead capable of jetting drops of dielectric material on demand;

aiming the output of said first printhead toward a selected first pad on the connection surface;

building a column of solidified solder drops upon said first pad, by operating said first printhead, said column extending away from the connection surface;

aiming the output of said first printhead toward successive selected pads on the connection surface and building a column of solidified solder drops extending away from the connection surface upon successive pads wherein said columns are all about an equal height above the connection surface;

aiming the output of said second printhead toward the connection surface;

building a protective layer of dielectric material on the connection surface by operating the second printhead and creating relative movement between the connection surface and the printhead until the columns of solidified solder are covered with the dielectric;

removing part of the dielectric to expose the top of the columns of solder; and converting the top of each solder column to a bump in readiness for a solder reflow operation whereby electrical leads are connected to the interconnect pads through said solder columns.

31. The method of claim 27 wherein the step of converting the top of each solder column to a bump is performed by printing a bump thereon.

32. The method of claim 27 wherein the step of connecting the top of each column to a bump is performed by exposing top of said solder columns to a solder reflow temperature for a sufficient time to convert the exposed tops to consolidated individual bumps that can be used in a further solder reflow operation to make electrical connections with said pads through said bumps.

* * * * *